(12) United States Patent
Chandra et al.

(10) Patent No.: US 10,352,996 B2
(45) Date of Patent: Jul. 16, 2019

(54) BACKPLANE TESTING SYSTEM

(71) Applicant: Dell Products L.P., Round Rock, TX (US)

(72) Inventors: Umesh Chandra, Santa Cruz, CA (US); Timothy Thinh Mai, San Jose, CA (US)

(73) Assignee: Dell Products L.P., Round Rock, TX (US)

( * ) Notice: Subject to any disclaimer, the term of this patent is extended or adjusted under 35 U.S.C. 154(b) by 96 days.

(21) Appl. No.: 15/350,902

(22) Filed: Nov. 14, 2016

(65) Prior Publication Data

US 2017/0059656 A1    Mar. 2, 2017

Related U.S. Application Data

(63) Continuation of application No. 14/644,867, filed on Mar. 11, 2015, now Pat. No. 9,551,746.

(51) Int. Cl.
| | |
|---|---|
| *G06F 11/20* | (2006.01) |
| *G01R 31/317* | (2006.01) |
| *G01R 31/319* | (2006.01) |
| *G06F 11/00* | (2006.01) |
| *G01R 31/3181* | (2006.01) |
| *G01R 31/3177* | (2006.01) |

(52) U.S. Cl.
CPC ... *G01R 31/31703* (2013.01); *G01R 31/3177* (2013.01); *G01R 31/31708* (2013.01); *G01R 31/31712* (2013.01); *G01R 31/31716* (2013.01); *G01R 31/31813* (2013.01); *G01R 31/31907* (2013.01); *G06F 11/00* (2013.01)

(58) Field of Classification Search
None
See application file for complete search history.

(56) References Cited

U.S. PATENT DOCUMENTS

| | | | |
|---|---|---|---|
| 2006/0107154 A1* | 5/2006 | Bansal | G01R 31/31716 714/738 |
| 2007/0069737 A1* | 3/2007 | Van Treuren | G01R 31/043 324/538 |
| 2007/0136631 A1* | 6/2007 | Govani | G01R 31/318508 714/738 |
| 2007/0174748 A1* | 7/2007 | Jaworski | G01R 31/318508 714/727 |
| 2010/0251021 A1* | 9/2010 | Li | H04L 49/40 714/27 |

(Continued)

*Primary Examiner* — Yolanda L Wilson
(74) *Attorney, Agent, or Firm* — Haynes and Boone, LLP

(57) ABSTRACT

A backplane testing system includes a test backplane coupled to a test device chassis and including a first connector system, a second connector system, and channels that connect the first connector system and the second connector system. A first test device in a first test device slot on the test device chassis engages the first connector system and provides a loop back circuit for the first connector system. A second test device in a second test device slot on the test device chassis engages the second connector system. The second test device sends a test signal through a channel on the test backplane such that the test signal is provided to the loop back circuit on the first test device and received back through the channel. The second test device analyzes the test signal that is received to determine a testing compliance of the channel on the test backplane.

20 Claims, 13 Drawing Sheets

(56) References Cited

U.S. PATENT DOCUMENTS

2013/0218509 A1\* 8/2013 Schroeder ............ G06F 11/263
            702/123
2016/0266204 A1  9/2016 Chandra et al.

\* cited by examiner

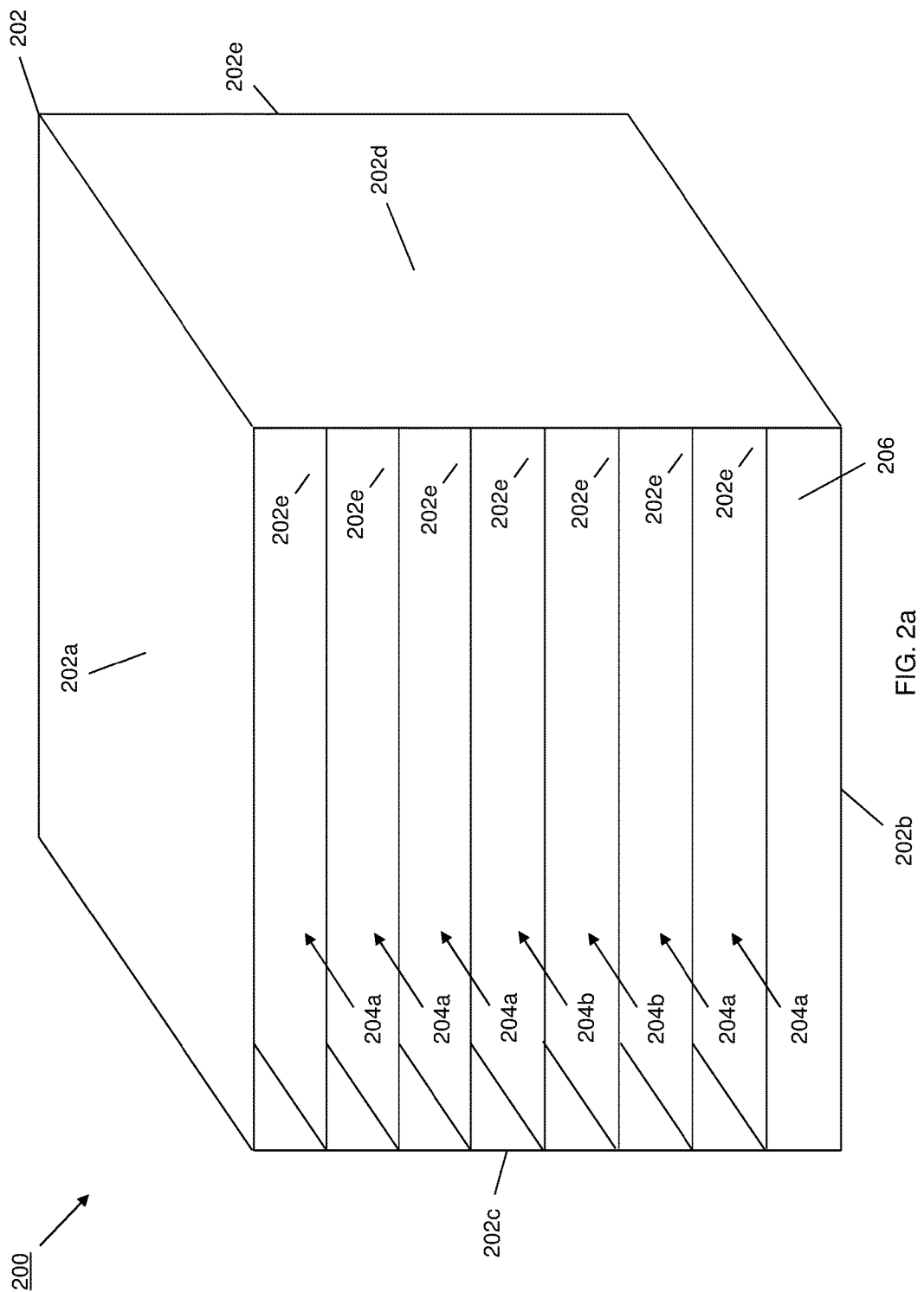

BACKPLANE TESTING SYSTEM

This is a Continuation application to U.S. Utility application Ser. No. 14/644,867 filed Mar. 11, 2015, entitled "Backplane Testing System,", the disclosure of which is incorporated herein by reference in its entirety.

BACKGROUND

The present disclosure relates generally to information handling systems, and more particularly to a testing system for a backplane used in an information handling system.

As the value and use of information continues to increase, individuals and businesses seek additional ways to process and store information. One option available to users is information handling systems (IHSs). An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As the speed at which IHSs operate and communicate increases, the need to design and build components that enable that speed of operation and communication arises. For example, current switches provide maximum port speeds (e.g., on a Quad Small Form-factor Pluggable (QSFP) port) of 40 GB/s, which may be enabled for each port by four individual Serializer/Deserializer (SerDes) links located on a backplane and each operating at 10 GB/s. However, when design begins to support switch components that can operate at a speed that is higher than current speeds, components that will enable that speed of operation must be designed and tested. Using the example above, to support a future switch that operates at a maximum port speed of 100 GB/s, a backplane that includes SerDes links each operating at 25 GB/s must be designed and tested. However, with current switch components limited to the current operation speeds, the testing of components that will enable the new, higher speeds that are desired in the future switches is complicated. Again using the example above, current line modules and route processing modules used with current switches are only designed to operate at 10 GB/s, and thus a speed test at 25 GB/s cannot be conducted on a 25 GB/s backplane design to confirm that future upgrades of switches to 25 GB/s will be enabled when line modules and route processing modules are designed that operate at that speed.

Conventionally, in order to test a new, higher speed backplane design for a new, higher speed switch when current switch components operate at current operation speeds, a Vector Network Analyzer (VNA) is typically used. A VNA is an expensive, specialized piece of equipment that requires a dedicated testing trace be included on a sample of the new backplane, and testing connectors added to the sample of the new backplane, to allow the VNA to be connected to the sample of the new backplane. The VNA then sends test signals (e.g., sine waves at different frequencies) through the dedicated testing trace and measures insertion loss and return loss. However, such conventional testing methods are time consuming to set up and run, making them unavailable for manufacturing floor test, and only provide for the testing of a sample of a backplane production run. Furthermore, these convention testing methods only test in the frequency domain, rather than the time domain in which the backplane is actually used. Further still, these conventional testing methods do not test actual channels in the backplane. Rather, they test only the dedicated testing trace, and thus localized defects in the backplane that are not in the same area as the dedicated testing trace will not be detected. Finally, these conventional testing methods are relatively expensive. For example, a 50 GHz VNA needed to test for 25 GB/s speeds in a backplane currently costs over $200,000 USD.

Accordingly, it would be desirable to provide an improved backplane testing system.

SUMMARY

According to one embodiment, a networking device backplane testing system includes a line module loop back test device that is configured to engage a line module connector system on a test backplane, wherein the line module loop back test device provides a loop back circuit for the line module connector system; and a route processing module test device that is configured to engage a route processing module connector system on the test backplane, wherein the route processing module test device is configured to send a test signal through at least one of a plurality of channels on the test backplane such that the test signal is provided to the loop back circuit on the line module loop back test device and received back through the at least one of the plurality of channels the test backplane, and wherein the route processing module test device is configured to analyze the test signal that is received to determine a testing compliance of the at least one of the plurality of channels on the test backplane.

BRIEF DESCRIPTION OF THE DRAWINGS

FIG. 2a is a perspective view illustrating an embodiment of test device chassis.

FIG. 2b is a side view illustrating an embodiment of the test device chassis of FIG. 2a.

FIG. 3b is a schematic view illustrating an embodiment of the transmitter links between connectors on the test backplane of FIG. 3a.

FIG. 3c is a schematic view illustrating an embodiment of the receiver links between connectors on the test backplane of FIG. 3a.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
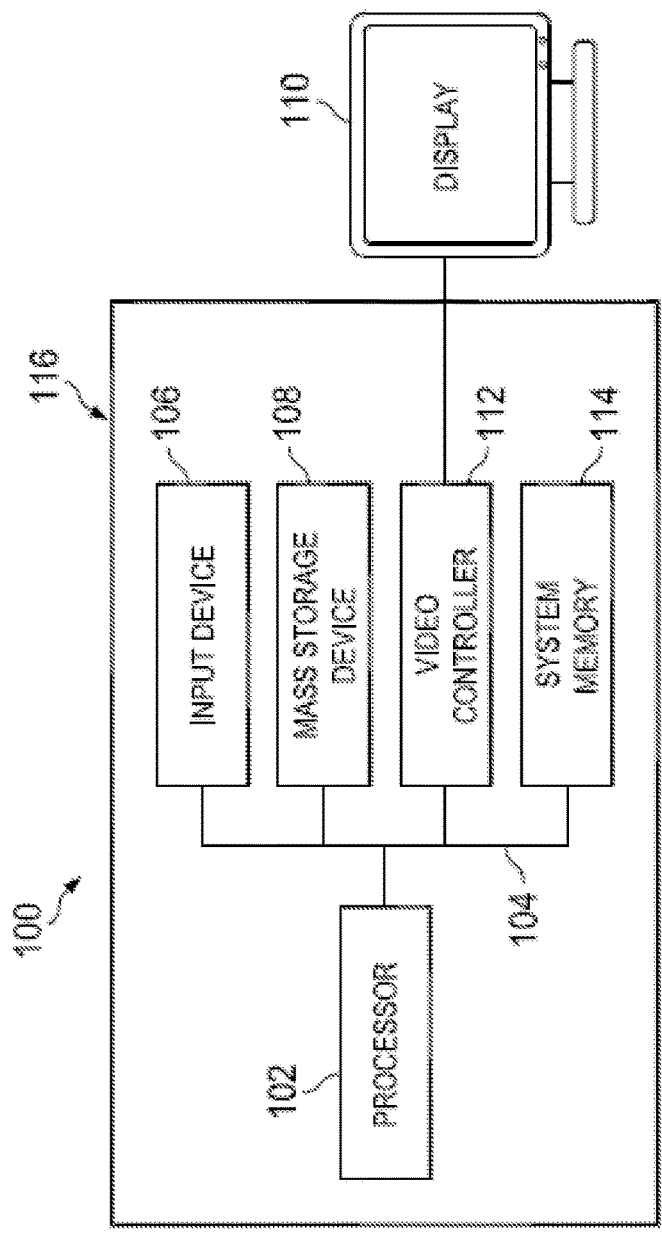
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2B:
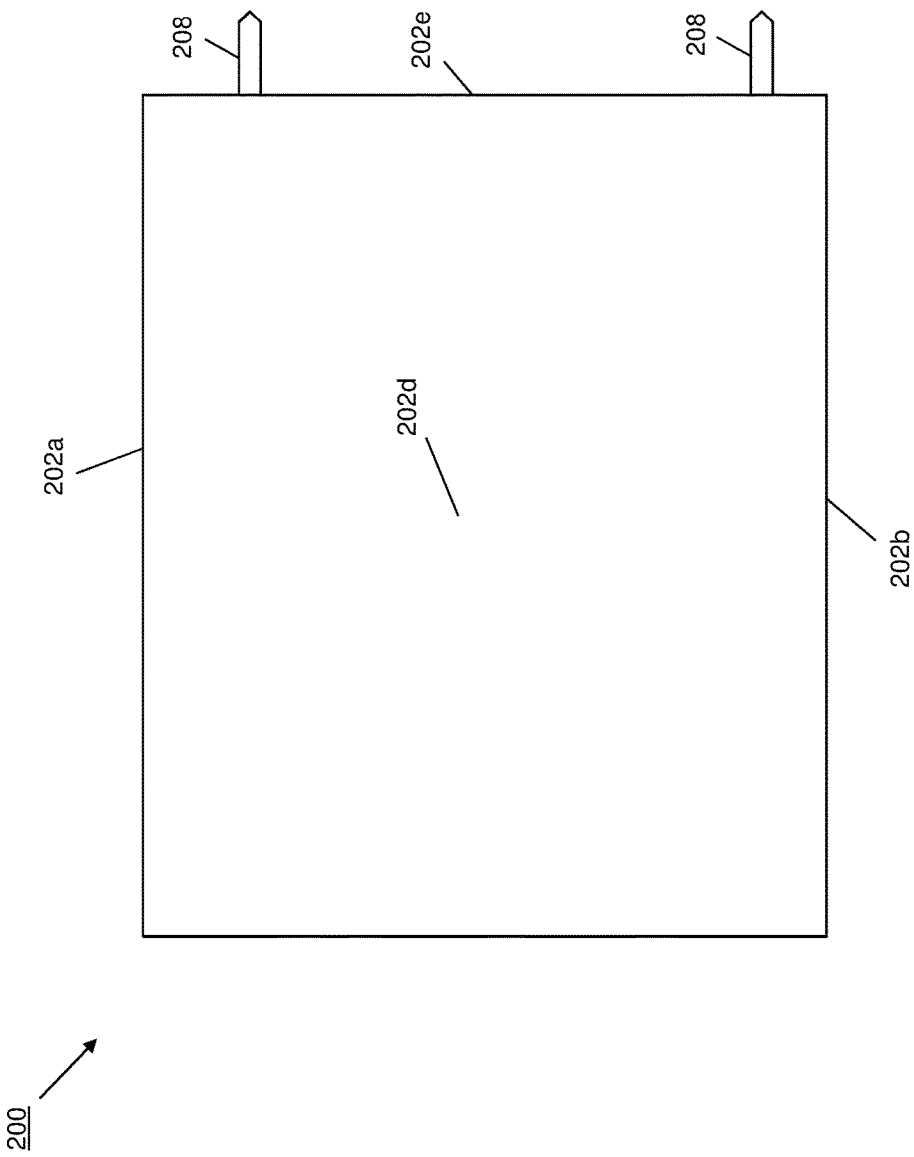

Referring now to FIGS. 2a and 2b, an embodiment of a test device chassis 200 is illustrated. The test device chassis 200 includes a base 202 having a top wall 202a, a bottom wall 202b located opposite the base 202 from the top wall 202a, a side wall 202c extending between the top wall 202a and the bottom wall 202b, a side wall 202d located opposite the base 202 from the side wall 202c and extending between the top wall 202a and the bottom wall 202b, and a rear wall 202e extending between the top wall 202a, the bottom wall 202b, and the side walls 202c and 202d. A plurality of intermediate walls 202f extend between the side walls 202c and 202d in a spaced apart orientation to define a plurality of first test device slots 204a and second test device slots 204b. A power supply and/or fan section 206 is located on the base between the bottom wall 202b and one of the intermediate walls 202e, and may house power supply systems, fan systems, and/or other components known in the art. A plurality of test backplane coupling member 208 extend from the rear wall 202e. While not illustrated for clarity, the test device chassis 200 may include a variety of additional and/or different features other than those illustrated in FIGS. 2a and 2b, including features for coupling test devices to the test device chassis 200 in the test device slots 204a and 204b, as well electrical and/or physical connections for coupling test devices and/or components to each other, and/or other chassis features known in the art while remaining within the scope of the present disclosure.

In the embodiments illustrated and described herein, a specific test device chassis 200 is provided for specific type of backplane that couples to route processing modules and line modules to provide network switching system. However, the teachings of the present disclosure may be applied to test a variety of components for a variety of devices while remaining within the scope of the present disclosure. Furthermore, while referred to herein as a "test device chassis", in some embodiments, the test device chassis 200 may be a "production chassis" that is offered for sale to the public and configured to couple production backplanes, route processing modules, and line modules together. In other words, the route processing module test devices and line module test devices discussed below may be configured to couple to a production device chassis that is configured to couple to a production backplane, production route processing modules, and production line modules, and the testing discussed below may be performed on the production backplane substantially as discussed below for the test backplane.

Figure 3A:
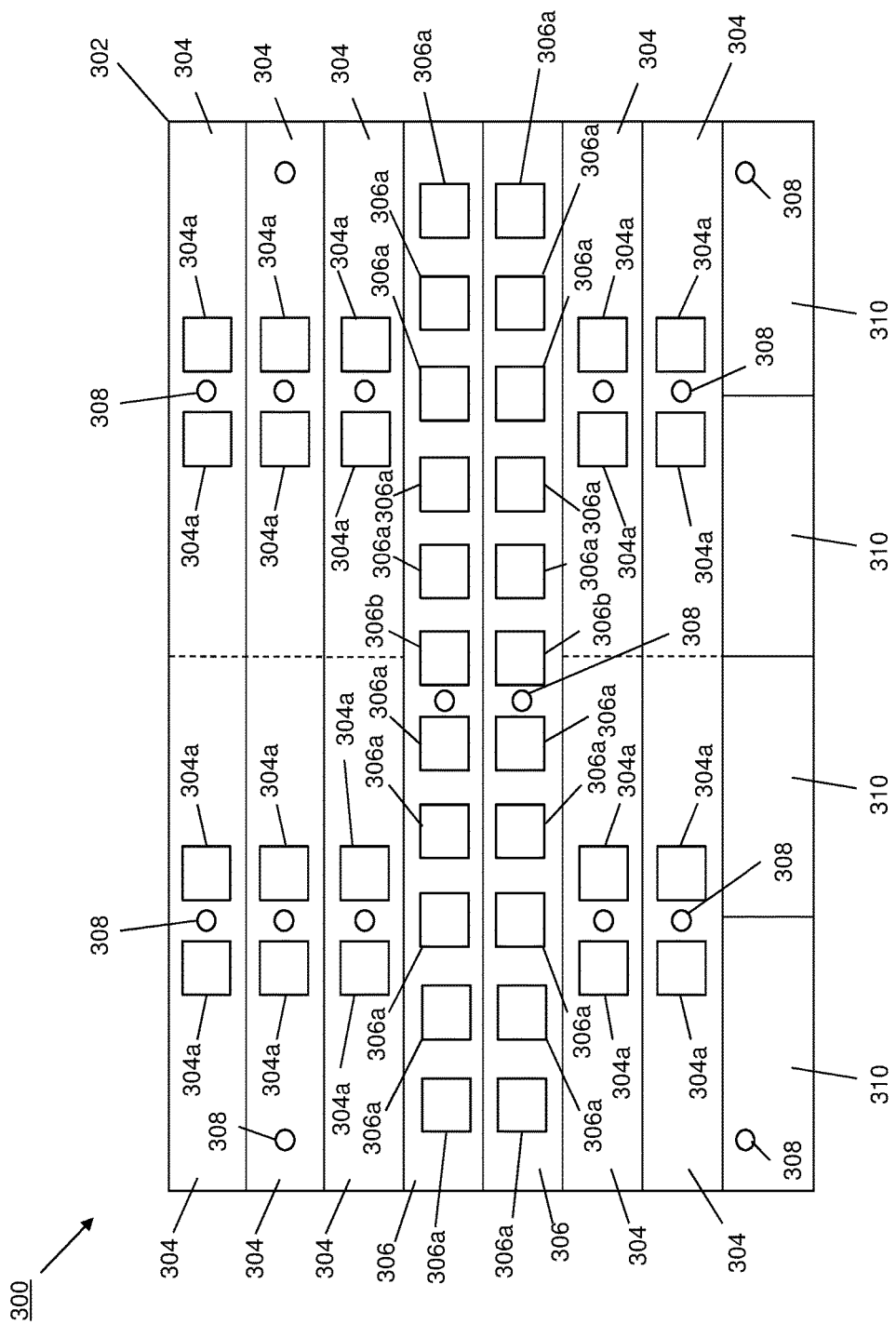
FIG. 3a is a front view illustrating an embodiment of a test backplane.

Referring now to FIG. 3a, an embodiment of a test backplane 300 is illustrated. In the embodiments discussed below, the test backplane 300 is configured to couple to route processing modules and line modules to provide for signal transfer between the two in performing networking communications at a first transmission rate (e.g., 25 GB/s). However, currently available line modules and route processing modules may operate at a second transmission rate that is lower than the first transmission rate (e.g., 10 GB/S), and the route processing module test devices and line module test devices discussed below are provided to test the compliance of the test backplane 300 with a plurality of different compliance factors including a speed testing compliance (e.g., whether the test backplane 300 transmits signals at 25 GB/s). However, one of skill in the art will recognize that different types of components similar to the test backplane 300 may be designed for different types of systems do not currently support testing of those components, and those components may be tested according to the teachings of the present disclosure while remaining within its scope. As such, the specific configuration of the test backplane 300 discussed below is not meant to be limiting, but rather to simply provide an example of an implementation of the ideas encompassed by the present disclosure.

The test backplane 300 includes a base 302 that may include, for example, a circuit board. In the illustrated embodiment, the base 302 includes a plurality of first test device sections 304 and a plurality of second test device sections 306. In the examples illustrated and described below, the first test device sections 304 are line module sections 304 that are configured to couple a line module to the test backplane 302, while the second test device sections 306 are route processing module sections 306 that are configured to couple a router processing module to the test backplane 300. Each of the first test device sections 304 include a plurality of first connectors 304a (e.g., two connectors 304a in the illustrated embodiment) that are configured to couple a first device to the test backplane 300, and each of the second test device sections 306 include a plurality of second connectors 306a and 306b (e.g., ten connectors 306a and one connector 306b in the illustrated embodiment) that are configured to couple a second device to the test backplane 300. For example, the first connectors 304a in each first test device section 304 include a line module transmitter connector and a line module receiver connector, while the second connectors 306a in each second test device section 306 include ten route processing module transmitter/receiver connectors, discussed in further detail with reference to FIGS. 3b and 3c. A plurality of coupling apertures 308 are defined by the test backplane 300 and located in different locations on the test backplane 300 (e.g., between the first connectors 304a in each first test device section 304, and between one of the second connectors 306a and the second connector 306b in each second test device section 306). In the illustrated embodiment, a plurality of power system and/or fan system sections 310 are located on the test backplane 300, and may include a variety of power and/or fan couplings known in the art.

Figure 3B:
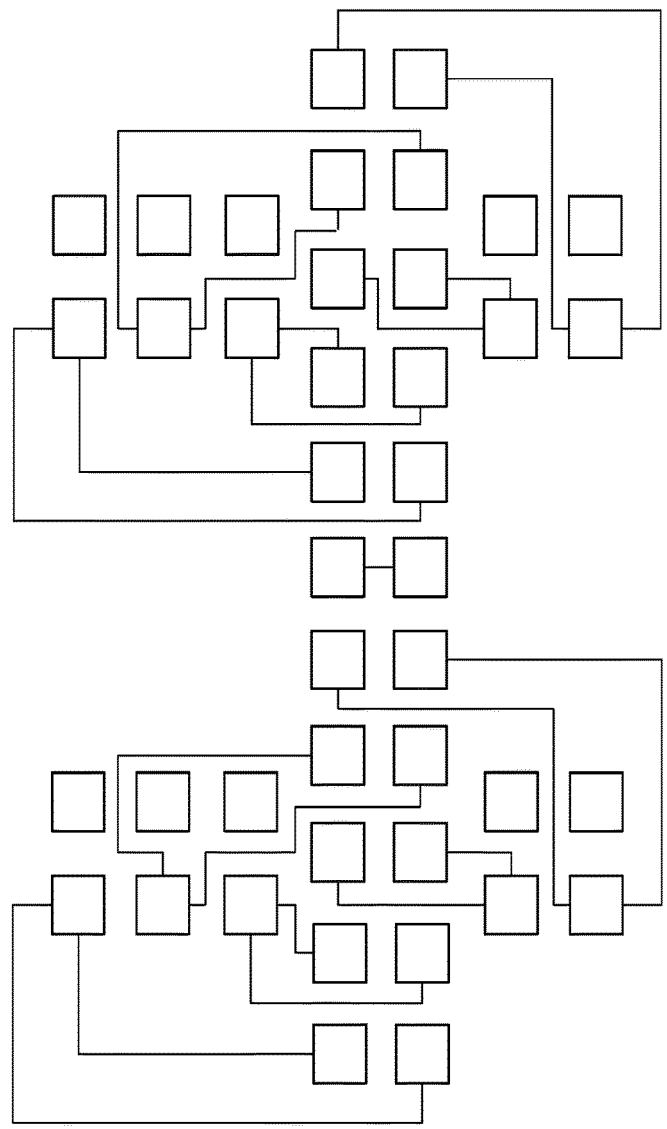
Figure 3C:
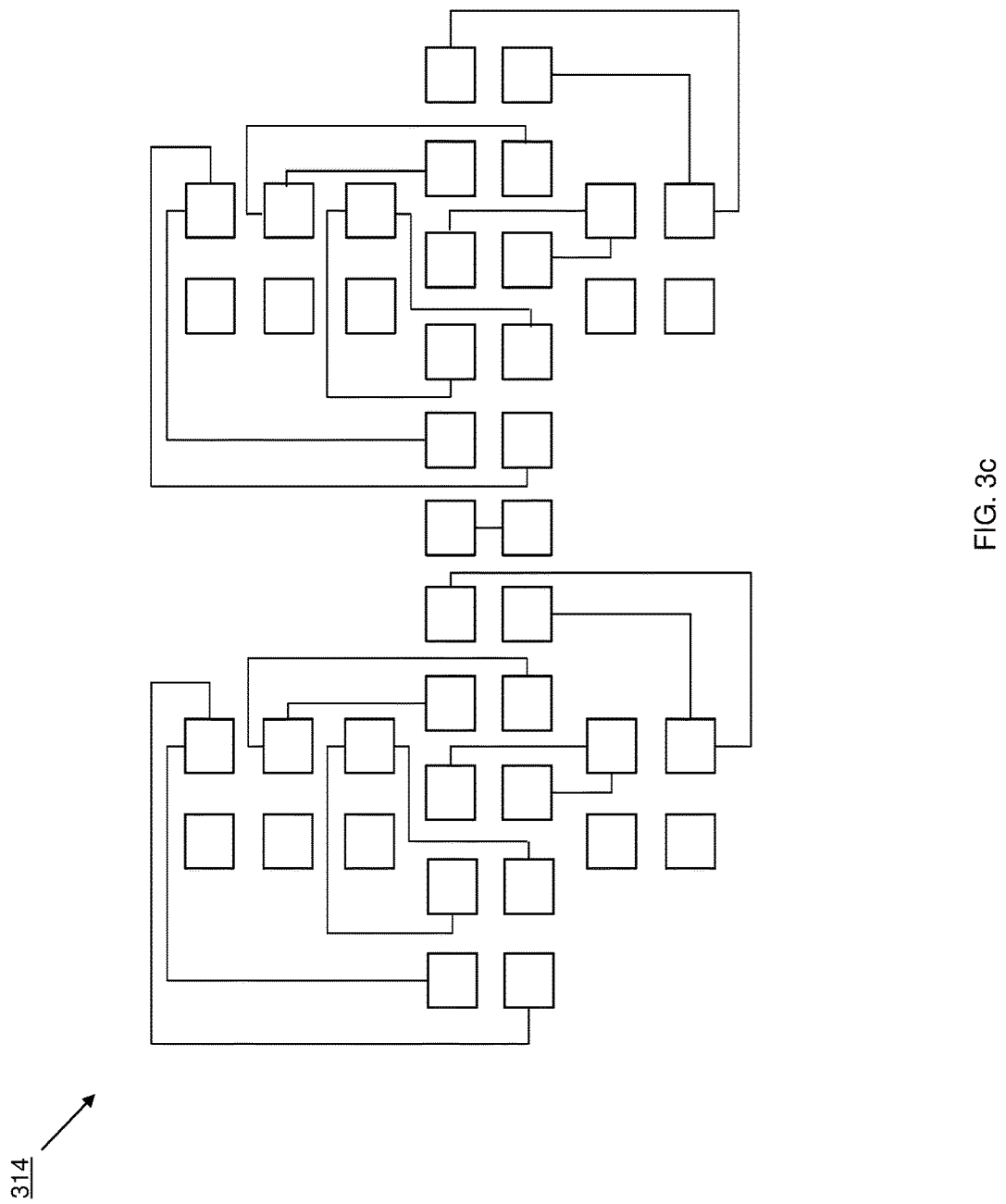

Referring now FIGS. 3a, 3b, and 3c, and embodiment of the connections between the first connectors 304a and the second connectors 304a on the test backplane 300 is illustrated without element numbers for clarity. However, the configuration and relative locations of the first connectors 304a and the second connectors 306a and 306b illustrated in FIGS. 3a, 3b, and 3c are kept consistent for reference. FIG. 3b illustrates the transmitter connections 312 provided by the test backplane 300 between the line module transmitter connectors (e.g., one of each of the first connectors 304a in each first test device section 304 on the test backplane 300) and the route processing module transmitter connectors (e.g., each connector 306a in each second test device section 306 on the test backplane 300), while FIG. 3c illustrates the receiver connections 314 provided by the test backplane 300 between the line module receiver connectors (e.g., one of each of the first connectors 304a in each first test device section 304 on the test backplane 300) and the route processing module receiver connectors (e.g., each connector 306a in each second test device section 306 on the test backplane 300). Furthermore, FIG. 3b illustrates the transmitter connection between the route processing module connectors (e.g., the second connectors 306b in each second test device section 206), while FIG. 3c illustrates the receiver connection between the route processing module connectors (e.g., the second connectors 306b in each second test device section 206). In an embodiment, the route processing module connectors 306b may be connected together via three HiGig links in the test backplane 300 in order to allow the route processing modules or the route processing module test devices, discussed below, to communicate directly. In an embodiment, each of the lines that connect the connectors in FIGS. 3b and 3c represents twelve transmitter connections and twelve receiver connections, respectively, as discussed in further detail below. The transmitter connections and receiver connections provided by the test backplane 300 were provided in an experimental embodiment in which those connections were designed to transmit 25 GB/s signals, and the ability to provide that transmission speed was tested as discussed in further detail below.

Figure 4:
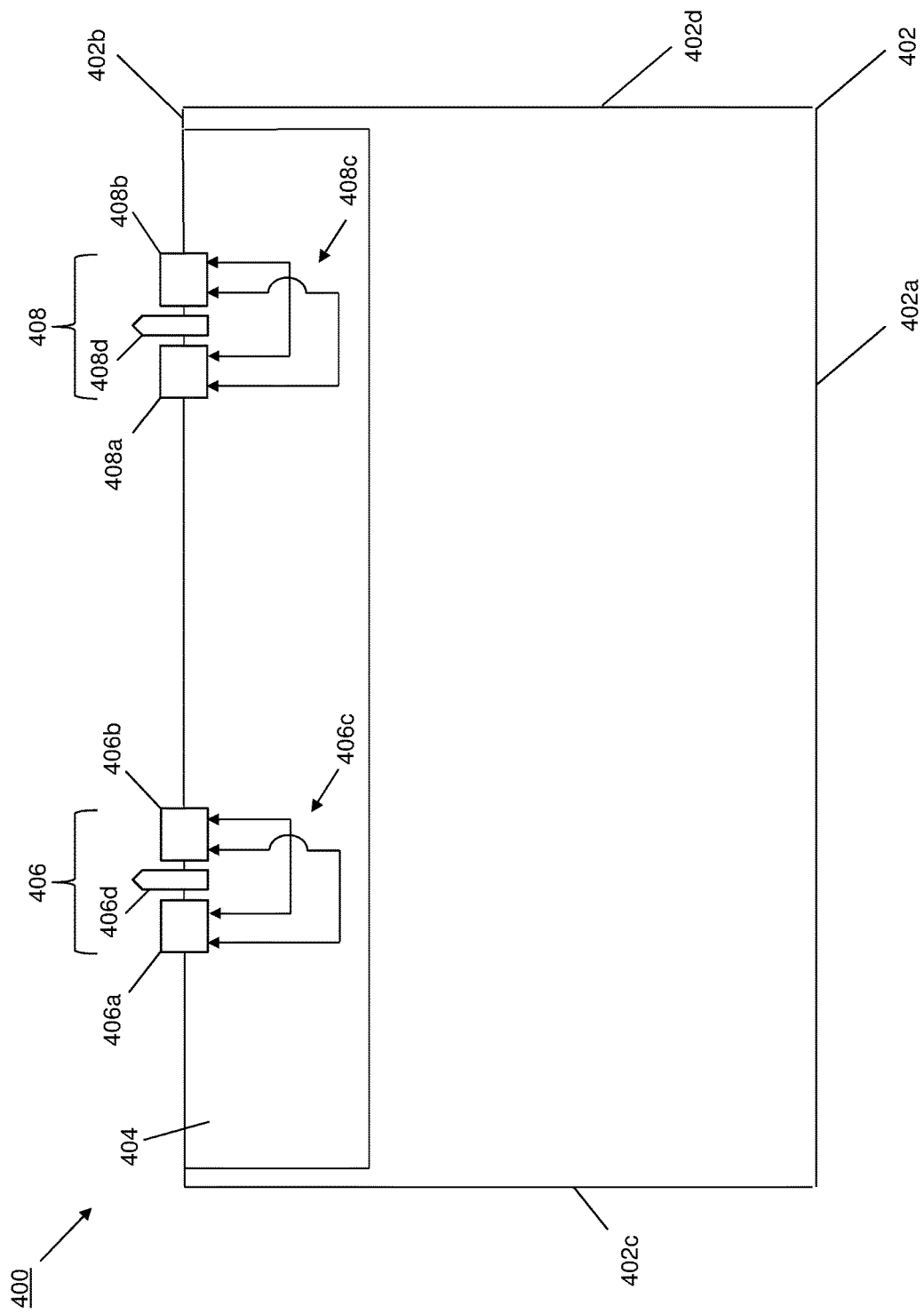
FIG. 4 is a top/schematic view illustrating an embodiment of a line module test device.

Referring now to FIG. 4, an embodiment of a first test device 400 is illustrated. In the embodiments illustrated and discussed below, the first test device 400 is a line module loop back test device (a "line module test device" hereinafter) that is configured to couple to the test backplane 300 in order to assist in testing the compliance of the test backplane 300 with a plurality of different compliance factors. However, one of skill in the art will recognize that different components similar to the test backplane 300 may be designed for different types of systems, and test devices with similar functionality to the first test device 400 but with different configurations may be provided according to the teachings of the present disclosure while remaining within its scope. As such, the specific configuration of the first test device 400 discussed below is not meant to be limiting, but rather to simply provide an example of an implementation of the ideas encompassed by the present disclosure.

The first test device 400 includes a chassis 402 having a front surface 402a, a rear surface 402b located opposite the chassis from the front surface 402a, and a plurality of side surfaces 402d and 402d extending between the front surface 402a and the rear surface 402b and located opposite the chassis 402 from each other. As discussed below, the chassis 402 is configured to be positioned in the test device slots 204a and coupled to the test device chassis 200 and, as such, may include coupling features (e.g., on the side surfaces 402c and 402d), user engagement features (e.g., handles on the front surface 402a), and/or a variety of other features known in the art. A board 404 is located on the chassis 402 adjacent the rear surface 402b and between the side surfaces 402c and 402d. The first test device 400 includes a first test backplane coupling feature 406 and a second test backplane coupling feature 408. The first test backplane coupling feature 406 includes a first connector 406a and a second connector 406b that are coupled to a loop back circuit 406c in the board 404, discussed in further detail below with reference to FIG. 10, as well as a guide pin 406d that extends past the rear surface 402b of the chassis 402. The second test backplane coupling feature 408 includes a first connector 408a and a second connector 408b that are coupled to a loop back circuit 408c in the board 404, discussed in further detail below with reference to FIG. 10, as well as a guide pin 408d that extends past the rear surface 402b of the chassis 402. In the embodiments discussed below, the first test device 400 provides a line module test device that "loops back" test signals sent to two different line module sections 304 on the test backplane 300, discussed in further detail below, using the first test backplane coupling feature 406 and the second test backplane coupling feature 408, respectively.

Figure 5:
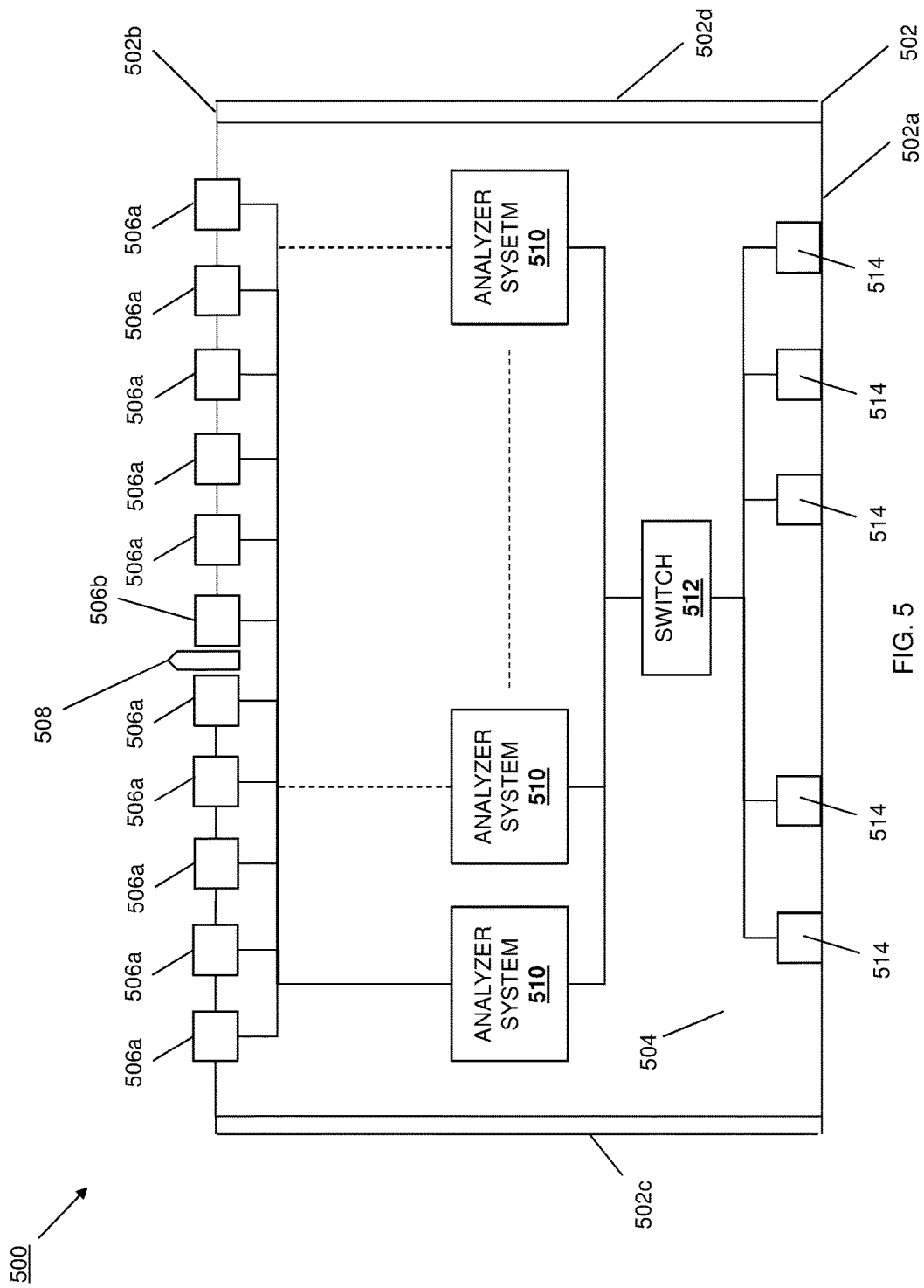
FIG. 5 is a top/schematic view illustrating an embodiment of a route processing module test device.

Referring now to FIG. 5, an embodiment of a second test device 500 is illustrated. In the examples illustrated and discussed below, the second test device 500 is a route processing module test device that is configured to couple to the test backplane 300 in order to assist in testing the compliance of the test backplane 300 with a plurality of different compliance factors. However, one of skill in the art will recognize that different components similar to the test backplane 300 may be designed for different types of systems, and test devices with similar functionality to the second test device 500 but different configurations may be provided according to the teachings of the present disclosure while remaining within its scope. As such, the specific configuration of the second test device 500 discussed below is not meant to be limiting, but rather to simply provide an example of an implementation of the ideas encompassed by the present disclosure.

The second test device 500 includes a chassis 502 having a front surface 502a, a rear surface 502b located opposite the chassis from the front surface 502a, and a plurality of side surfaces 502d and 502d extending between the front surface 502a and the rear surface 502b and located opposite the chassis 502 from each other. As discussed below, the chassis 502 is configured to be positioned in the test device slots 204b and coupled to the test device chassis 200 and, as such, may include coupling features (e.g., on the side surfaces 502c and 502d), user engagement features (e.g., handles on the front surface 502a), and/or a variety of other features known in the art. A board 504 is located on the chassis 502 between the side surfaces 502c and 502d. The second test device 500 includes a test backplane coupling feature that includes a plurality of connector 506a and 506b, as well as a guide pin 508 that extends past the rear surface 402b of the chassis 402. A plurality of analyzer systems 510 are included on the board 504 and coupled to the connectors 506a. For example, fifteen channel analyzer processors may be included on the board 504, and each channel analyzer processor may be configured to test and analyze sixteen differential pairs (for a total of 240 differential pairs analyzed by the fifteen channel analyzer processors), as discussed in further detail below. In an experimental embodiment, Avago AVSP 8801 28G unidirectional retime/repeater chips were provided as part of the analyzer systems 510. A switch 512 such as, for example, an I2C switch, is coupled to the plurality of analyzer systems 510 and to a plurality of network connectors 514 such as, for example, Ethernet ports. In the embodiments discussed below, the second test device 500 provides a route processing module test device that creates and sends test signals from the route processing module connectors (e.g., route processing module connectors 306a in the router processing module sections 306 on the test backplane 300, discussed in further detail below) to the line module connectors through a backplane (e.g., line module connectors 304a in the line module sections 304 on the test backplane 300, discussed in further detail below).

Figure 6:
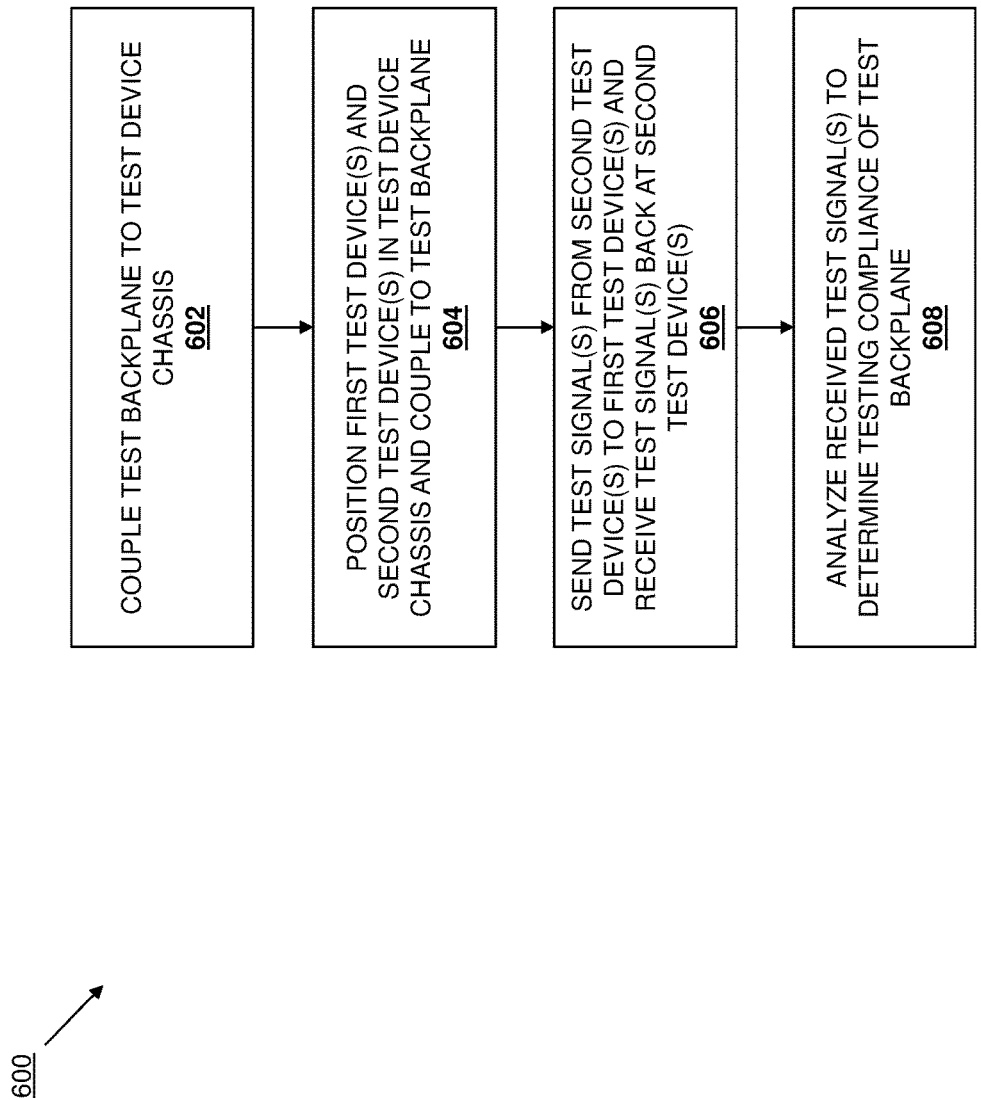
FIG. 6 is a flow chart illustrating an embodiment of a method for testing a backplane.
Figure 7:
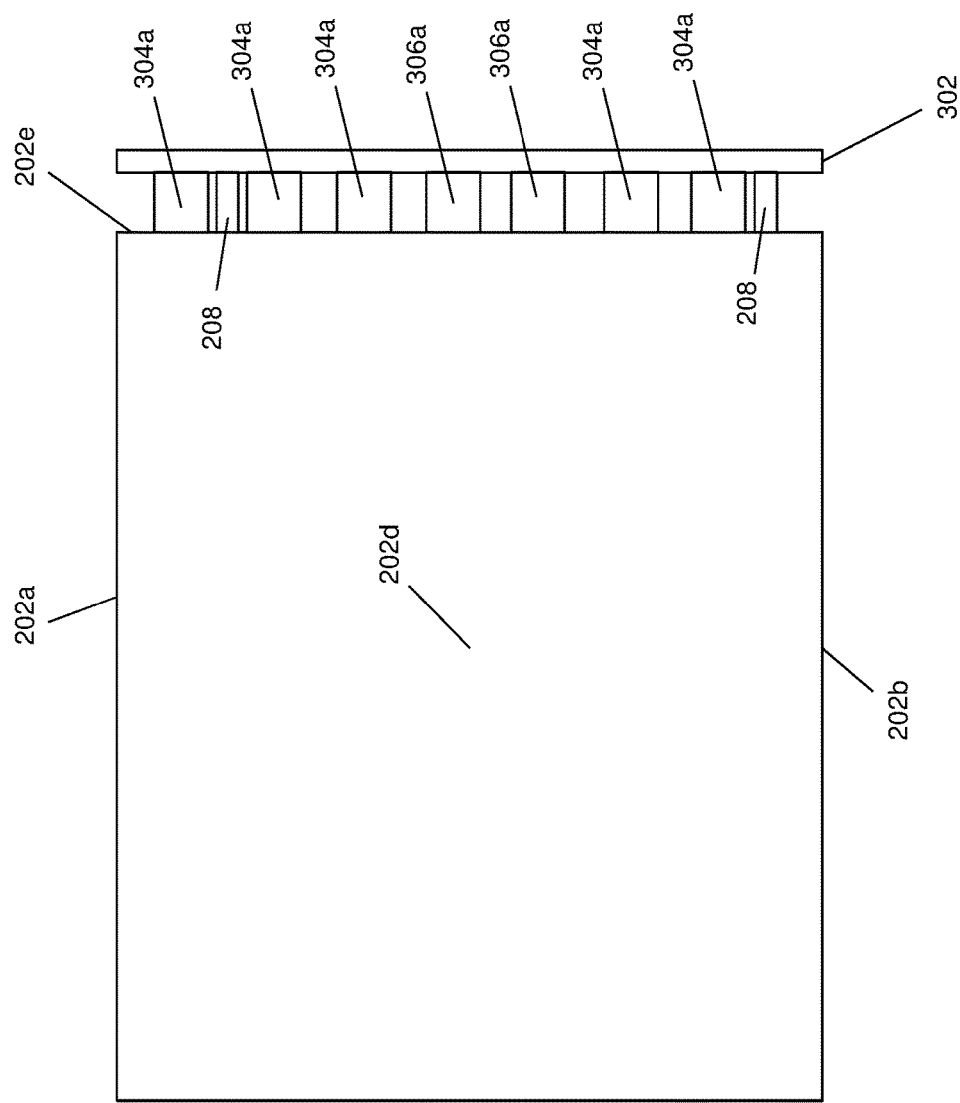
FIG. 7 is a side view of the test backplane of FIG. 3 coupled to the test device chassis of FIGS. 2a and 2b.

Referring now to FIG. 6, an embodiment of a method 600 for testing a backplane is illustrated. The method 600 begins at block 602 where a test backplane is coupled to a test device chassis. Referring now to FIGS. 2a, 2b, 3a, and 7, in an embodiment of block 602, the test backplane 300 is positioned adjacent the test device chassis 200 such that the first connectors 304a and second connectors 306a and 306b on the test backplane 300 are facing the rear wall 202e of the test device chassis 200, with the coupling apertures 308 that are adjacent the perimeter of the test backplane 300 aligned with the test backplane coupling members 208 on the test device chassis 200. In some embodiments, the test backplane 300 may be coupled to a testing fixture that is configured to mount to the test device chassis 200. The test backplane 300 may then be moved towards the test device chassis 200 such that the test backplane coupling members 208 engage the test backplane 300 (or the testing fixture to which the test backplane 300 is coupled) through the coupling apertures 308 to couple the test backplane 300 to the test device chassis 200.

Figure 8:
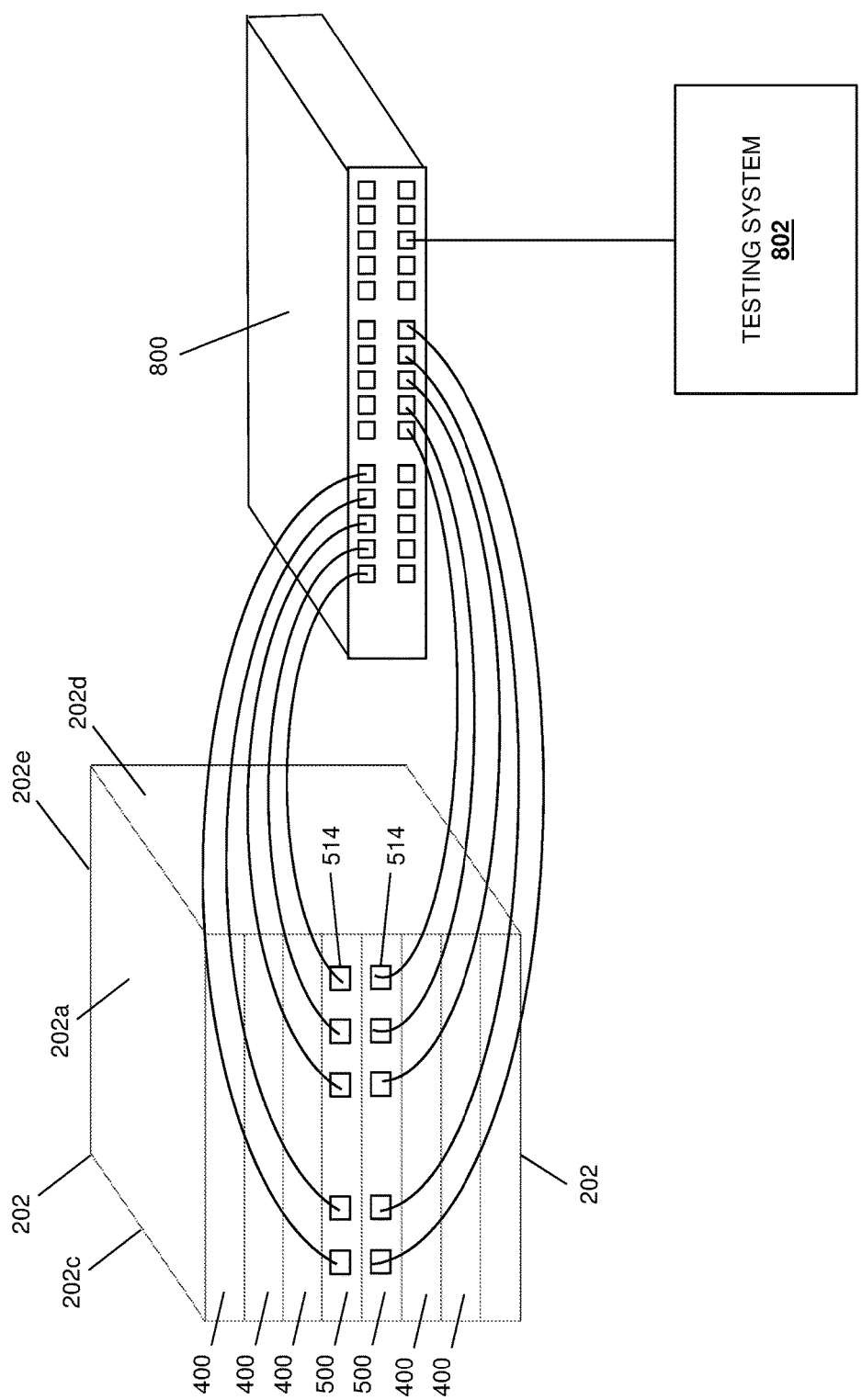
FIG. 8 is a perspective/schematic view illustrating an embodiment of a plurality of the line module test devices of FIG. 4 and the route processing module test devices of FIG. 5 coupled to the test device chassis of FIGS. 2a and 2b, the test backplane of FIGS. 3a-c, and to a testing system.

The method 600 then proceeds to block 604 where first test device(s) and second test device(s) are positioned in the test device chassis and coupled to the test backplane. In an embodiment, referring now to FIGS. 2a, 4, 5, and 8, first test device(s) 400 may be positioned adjacent the test device chassis 200 such that the rear surface 402b of the first test device 400 is located adjacent the first test device slot 204a, and those first test device(s) 400 may then be moved through the first test device slot 204a until the guide pins 406d and 408d on the first test device(s) 400 engage the coupling apertures 308 on the test backplane 300, and the first test backplane coupling feature 406 and the second test backplane coupling feature 408 engage the first connectors 304a in respective first test device sections 304 on the test backplane 300. Similarly, second test device(s) 500 may be positioned adjacent the test device chassis 200 such that the rear surface 502b of the second test device 500 is located adjacent the second test device slot 204b, and those second test device(s) 500 may then be moved through the second test device slot 204b until the guide pins 508 on the second test device(s) 500 engage the coupling apertures 308 on the test backplane 300, and connectors 506a and 506b on the second test device 500 engage the second connectors 306a and 306b in the second test device section 306 on the test backplane 300. As such, a first test device 400 may be positioned in each of the first test device slots 204a, and a second test device 500 may be positioned in each of the second test device slots 204b, as illustrated in FIG. 8. In some embodiments, power supplies and/or fan systems may be provided in the power supply and/or fan section 206 of the test device chassis 200 and coupled to the test backplane 300. In addition, each of the network connections 514 on the second test devices 500 may be coupled to a switch 800 that is further coupled to a testing system 802 in order to allow the testing system 802 to communicate with the second test devices 500 through the switch 800.

In an embodiment, the testing system 802 may be the IHS 100 discussed above with reference to FIG. 1 and/or may include some or all of the components of the IHS 100. For example, the testing system 802 may include a processing system (not illustrated, but which may be the processor 102 discussed above with reference to FIG. 1) that is coupled to a memory system (not illustrated, but which may be the system memory 114 discussed above with reference to FIG. 1) that includes instructions that, when executed by the processing system, cause the processing system to perform the functions of the testing systems discussed below.

Figure 9:
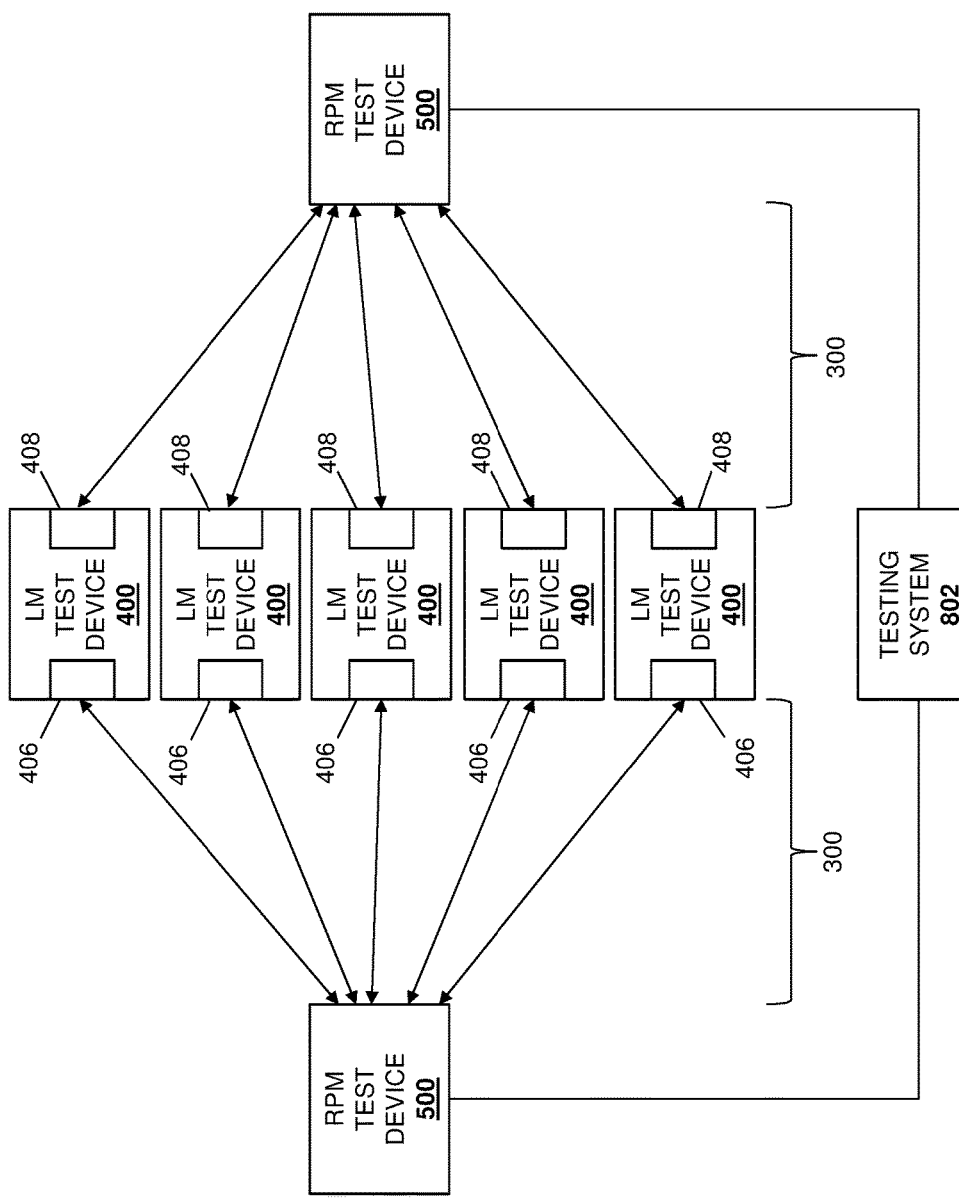
FIG. 9 is a schematic view illustrating an embodiment of a plurality of the line module test devices of FIG. 4 and the route processing module test devices of FIG. 5 coupled to the test device chassis of FIGS. 2a and 2b, the test backplane of FIGS. 3a-c, and to a testing system.

Referring now to FIG. 9, an embodiment of the connections between a plurality of route processing module test devices 500 to a plurality of line module test devices 400 through the backplane 300, and to the testing system 802, following block 604 of the method 600 is illustrated schematically. In the illustrated embodiment, each of the five line module test devices 400 is coupled to each of the route processing module test devices 500 via twelve transmitter links and twelve receiver links (indicated by the double sided arrows in FIG. 9) in the test backplane 300 (e.g., each pair of link module connectors 304a in a link module device section 304 on the test backplane 300 includes a transmitter connector connected to twelve transmitter links on the test backplane 300, (see FIG. 3b), and a receiver connector connected to twelve receiver links on the test backplane 300, (see FIG. 3c). With twenty four links per link module section 304, and ten link module sections 304 on the test backplane 300, two hundred and forty links are provided on the test backplane 300 between the route processor module connectors 306a and the link module connectors 304a. As discussed above, each of the analyzer systems 510 included in the route processor module test device 500 may be configured to test and analyze sixteen differential pairs (i.e., a transmitter link pair and a receiver link pair) in the test backplane 300, which allows for the plurality of analyzer systems 510 included in the route processor module test device 500 to test and analyze all 240 of the links provided on the test backplane 300, as discussed in further detail below, when the line module test devices 400 and the route processing module test devices 500 are coupled to the test backplane 300.

Figure 10:
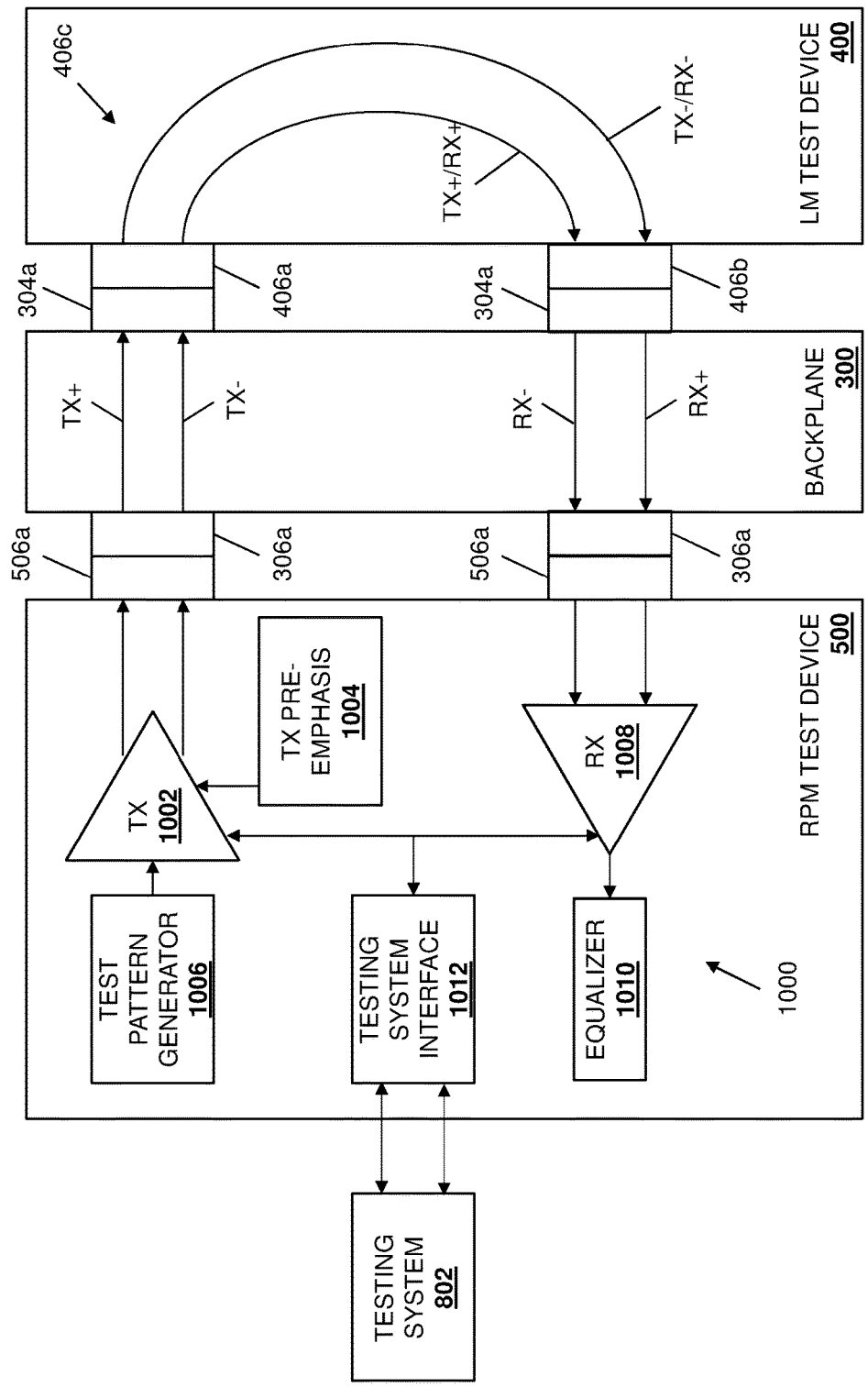
FIG. 10 is a schematic view illustrating an embodiment of the line module test device of FIG. 4 and the route processing module test device of FIG. 5 coupled to the test backplane of FIGS. 3a-c and to a testing system.

The method 600 then proceeds to block 606 where test signal(s) are sent from the second test device(s) to the first test device(s), and received back at the second test device(s). Referring to FIG. 10, a schematic view of a line module test device 400 and a route processing module test device 500 coupled to the backplane 300 is provided illustrating a single channel of the test backplane 300 that include a transmitter link pair of the channel and a receiver link pair of the channel. As can be seen in FIG. 10, the transmitter link pair of the channel in the test backplane 300 is illustrated with a positive transmitter link TX+ and a negative transmitter link TX−, and the receiver link pair of the channel in the test backplane 300 is illustrated with a positive receiver link RX+ and a negative receiver link RX−. FIG. 10 also illustrates the how the loop back circuit 406c operates to connect the positive transmitter link TX+ to the positive receiver link RX+ (Tx+/RX+) and the negative transmitter link TX− to the negative receiver link RX− (TX−/RX−).

In the illustrated embodiment of the route processing module test device 500, a portion of an analyzer system 1000, which may be a portion of any of the analyzer systems 510 discussed above with reference to FIG. 5, is illustrated. The portion of the analyzer system 1000 includes a transmitter 1002 (e.g., a 25 GB/s SerDes transmitter provided on a 25 GB SerDes re-timer chip) that is configured to transmit positive and negative signals through the connectors 506a on the route processing module test device 500 and the second connectors 306a on the test backplane 300 and to the positive transmitter link TX+ and the negative transmitter link TX− in the test backplane 300. The portion of the analyzer system 1000 also includes a transmitter pre-emphasis 1004 and a test pattern generator 1006 (e.g., a pseudorandom binary sequence (PRBS) test pattern generator) that are coupled to the transmitter 1002. The portion of the analyzer system 1000 also includes a receiver 1008 (e.g., a 25 GB/s SerDes receiver provided on a 25 GB SerDes re-timer chip) that is configured to receive positive and negative signals through the connectors 506a on the route processing module test device 500 and the second connectors 306a on the test backplane 300 and from the positive receiver link RX+ and the negative receiver link RX− in the test backplane 300. The receiver 1008 is coupled to an equalizer 1010 (e.g., a decision feedback equalizer (DFE)). A testing system interface 1012 (e.g., a graphical user interface (GUI) system interface) is coupled to each of the transmitter 1002 and the receiver 1008, and may be coupled to the testing system 802 as illustrated using, for example, a I2C interface, an management data input-output (MDIO) interface, a Joint Test Action Group (JTAG) interface, and/or other interfaces known in the art. As discussed above, the elements illustrated on the route processing module test device 500 provide a portion of an analyzer system 500/1000. Using the example discussed above where the analyzer systems 500 are channel analyzer processors that are configured to test and analyze sixteen differential pairs, each analyzer system 500 may include 8 transmitter/receiver pairs like those illustrated in FIG. 10.

In an embodiment of block 606, the testing system 802 may be used to program the analyzer systems 500/1000 to perform the functions discussed below for the test backplane 300. For example, the analyzer systems 500/1000 may be programmed by the testing system 802 to program register settings of the transmitter 1002 and the receiver 1008. The register settings of the transceiver 1002 may be used to control the transmitter pre-emphasis 1004 and the amplitude of the test signal, discussed below. The receiver 1008 may include an automatic gain control and a decision feedback equalizer that is placed in automatic mode and used to signal condition the receiver signal prior to detection of the test signal, discussed below. In an experimental embodiment, Netburner® software, available from Netburner, Inc. of San Diego, Calif., was provided on the analyzer systems 510 as a serial interface that was used to program the register settings in the analyzer systems 510.

Once programmed, at block 606 the test pattern generator 1006 may then generate test signal(s) that includes a PRBS test pattern and provide the test signal(s) to the transmitter 1002. As discussed above, in an experimental embodiment, an Avago AVSP 8801 28G unidirectional retime/repeater chip was used to generate and transmit the PRBS pattern, capture the eye details of the received test signal (discussed below), and detect errors. In an embodiment, the transmitter pre-emphasis 1004 may provide a pre-tap, a main tap, and/or a post tap that may operate to alter the shape of the 0 to 1 bit transition and also the 1 to 0 bit transition (e.g., the pre-tap doing so before the transition, the main tap doing so during the transition, and the post tap doing so after the transition.) The transmitter 1002 then transmits the test signal through the connector 506a on the route processing module test device 500 and the second connector 306a on the test backplane 300 and to the transmitter link pair of the channel in the test backplane 300. The test signal is then transmitted from the transmitter link pair of the channel in the test backplane 300, through the first connector 304a on the test backplane 300 and the connector 406a on the link module test device 400, and to the loop back circuit 406c. The test signal is then transmitted from the loop back circuit 406c, through the connector 406a on the link module test device 400 and the first connector 304a on the test backplane 300, and to the receiver transmitter link pair of the channel in the test backplane 300. The test signal is then transmitted from the receiver link pair of the channel in the test backplane 300, through the second connector 306a on the test backplane 300 and the connector 506a on the route processing module test device 500, and to the receiver 1008. In an embodiment, the equalizer 1010 may include a peaking filter, automatic gain control, an analog to digital converter, a decision feedback equalizer, and/or other components that condition the received test signal so that it can be properly detected by the testing system interface 1012. The test signal may then be provided by the receiver 1008 to the testing system interface 1012. Thus, each of the analyzer systems 510 in the route processing module test device 500 may operate at block 606 to generate test signals. Using the example provided above, each of the 15 channel analyzer processors may provide test signals to the test backplane 300 using its eight transmitters, and receive those test signals back from the test backplane 300 and line module test devices 400 through its eight receivers, in order to each test 16 differential pairs in the test backplane 300. As such, a test backplane with 240 differential pairs may have each of those differential pairs tested using the test signals provided by the 15 analyzer systems discussed above discussed above. One of skill in the art will recognize that the channels being tested in the test backplane 300 are double those utilized with production line modules and route processing modules coupled to a backplane (i.e., due to each channel test including the sending of the test signal through the transmitter link pair in the test backplane 300 and the receiving of that test signal back through the receiver link pair in the test backplane 300).

In some embodiments, the channel(s) between the second connectors 306b in each of the route processing module sections 306 on the backplane 300 may be tested. For example, a first of the route processing module test devices 500 may send a test signal (similarly as discussed above) through the connector 506b on that route processing module test device 500, through a first of the second connectors 306b on the test backplane 300, and through a transmitter link pair in the test backplane 300. That test signal may then be transmitted through a second of the second connectors 306b on the test backplane 300, through the connector 506b on a second of the route processing module test devices 500, and to a loop back circuit in the route processing module test device 500 that is similar to the loop back circuits in the line module test device 400. As such, that test signal is then provided back through the connector 506b on the second of the route processing module test devices 500, the second of the second connectors 306b on the test backplane 300, through a receiver link pair on the test backplane 300, and back to the first of the route processing module test devices 500.

The method 600 then proceeds to block 608 where the received test signal(s) are analyzed to determine a testing compliance of the test backplane. In an embodiment of block 608, the testing system interface 1012 provides the received test signals that have been transmitted through the test backplane 300 at block 606 to the testing system 802. In some embodiments of block 608, the analysis of the test signal(s) may be performed by the analyzer systems 510 in the route processing module test device 500, while in some embodiments of block 608, the analysis of the test signal(s) may be performed by the testing system 802. For example, the testing system interface 1012 may include a GUI interface system that is configured to determine eye details of the received test signal such as, for example, a received test signal eye opening. The testing system interface 1012 may then compare the received test signal eye opening with an eye mask to determine whether the channel through which that test signal was transmitted passes a speed testing compliance (e.g., whether the channel supports 25 GB/s transmission speeds). In an embodiment, the testing system interface 1012 may be configured to account for different channel lengths associated with different line module sections 304 on the test backplane 300, and adjust to the eye mask based on the channel being tested. The analysis of the test signal(s) may be automated in software in the route processing module test device 500 by creating a "keep out" region in the middle of the eye diagram, and comparing received test signal(s) to determine whether they fall within that keep out region of the eye diagram (and thus fail the testing compliance). In some embodiments, the testing system interface 1012 may be simplified to verify a particular eye height and width, instead of an eye mask.

In an embodiment, an eye diagram may be displayed to provide a visual representation of the pseudo random bit stream superimposed in a single bit cell (also called a unit interval), which basically includes all the 0 to 1 and 1 to 0 transitions superimposed in a single bit cell. In a perfect equalizer eye, there is an opening to distinguish between a 0 and 1 level, while a closed eye will result in the detector in the receiver being unable to properly distinguish between a 0 and 1 bit that was transmitted and will result in data transmission errors. In a speed compliance test, rather than looking at the eye diagram, an eye height (voltage) limit and an eye width (time) limit may be set to make sure that the received test signal is greater that the limits, making the testing of thousands of links in the test backplane 300 faster.

In some embodiments, the testing system 802 may receive the results of the analysis from the testing system interface 1012 (or determine those results itself), and then display the results of that test on a display device. The display of the results may include an eye diagram display, a pass/fail indication, and/or a variety of other testing result displays known in the art. In an embodiment, in the event the analysis of a received test signal shows that a channel in the test backplane 300 is not compliant with a test (e.g., a speed compliance test), detailed information about that channel (e.g., to illustrate the location of that channel on the test backplane 300) may be retrieved and displayed on the testing system 802. A channel mapping (e.g., a mapping of the links between line module connectors and route processing module connectors in the test backplane 300) may be included in the analyzer systems 500 and/or the testing system 802 to enable the determination of the location of a channel on the test backplane 300 that is not compliant with a test.

Other testing compliance that may be determined by the analysis at block 608 may include detecting link defects and identifying the location of such link defects, detecting damaged connectors and identifying them for replacement, and/or a variety of other backplane testing compliance scenarios known in the art. Furthermore, analysis of test signals across batches of test backplanes may be received, determined, and/or otherwise collected by the testing system 802. Such batch testing signal analysis may be utilized to look for trends in batches of backplanes (e.g., trends in the eye details discussed above) that may be used to determine whether a problem exists in the manufacture of those backplanes. For example, the detection of eye height/eye width degradation across different batches of backplanes may be indicative of a manufacturing issue that may be corrected once that degradation is detected.

In some embodiments, the teachings above may be used to test a backplane with fewer test devices than is illustrated. For example, a sample-based, partial test of a type of backplane may be conducted when enough data has been gathered that is indicative that the manufacture of that type of backplane is producing backplanes that consistently satisfy testing compliances. Using the specific example provided above, a test may be conducted using one of the route processing module sections 306 on the test backplane 300 (rather than the two illustrated above), and five line module sections 304 on the test backplane 300. In such a partial test, testing may include selecting a line module section 304 that is closest to the route processing module section 306 being tested, as well as selecting a line module section 304 that is furthest from the route processing module section 306 being tested, as those two line module sections are typically the most problematic with regard to testing compliance of backplanes.

Thus, systems and methods have been described that provide for the testing of channels in a backplane to determine a testing compliance of that backplane when production components that would allow for such testing are not available. The system provides test devices that generate test signals and transmit them through the channels in the backplane, as well as test devices that loop those test signals back through the channels to be analyzed for the testing compliance. The systems and methods of the present disclosure may be used on actual production backplanes (i.e., by coupling those production backplanes to the test device chassis 200 and first and second test devices 400 and 500) to test each of the channels provided in the backplane, which provides substantial benefits over conventional methods that require a specialized backplane that includes a testing trace that must be connected to expensive and specialized testing equipment (i.e., the VNA analyzer discussed above). For example, the five line module test devices and two route processing module test devices have a projected cost of approximately $6000 USD, compared to over $200,000 USD. As discussed above, the systems and methods described herein have been utilized in experimental embodiments to design and test a backplane that is capable of operating at 25 GB/s in each of four individual SerDes links from a plurality of QSFP ports, when only 10 GB/s line modules and route processor modules were available and thus prevented speed testing compliance to confirm that the backplane would operate at 25 GB/s when 25 GB/s line modules and route processing modules become available. However, one of skill in the art in possession of the present disclosure will recognize that benefits from the teachings provided herein will be applicable to future speed upgrades and other testing compliances while remaining within the scope of the present disclosure.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A backplane testing system, comprising:
a backplane that includes a first connector system, a second connector system, and a plurality of channels that connect the first connector system and the second connector system;
a first test device that engages the first connector system and that includes a loop back circuit;
a second test device that engages the second connector system and that is configured to:
send a test signal through the second connector system such that the test signal is provided through at least one of the plurality of channels on the backplane and through the first connector system to the loop back circuit on the first test device; and
receive the test signal back through second connector system in response to the loop back circuit routing the test signal through the first connector system such that the test signal is provided through at least one of the plurality of channels on the backplane and through the second connector system; and
at least one subsystem that is configured to:
analyze the test signal that was received by the second test device to determine a testing compliance of the at least one of the plurality of channels on the backplane.

2. The backplane testing system of claim 1, wherein the backplane is a networking device backplane, the first connector system is a line module connector system, and the second connector system is a route processing module connector system.

3. The backplane testing system of claim 1, wherein the first test device engages the first connector system that is configured to connect a plurality of devices to the backplane.

4. The backplane testing system of claim 1, wherein the first test device engages a transmitter connection and a receiver connection on the first connector system to connect the transmitter connection and the receiver connection to the loop back circuit.

5. The backplane testing system of claim 1, further comprising:
an analyzer system that is coupled to the second test device and that is configured to:
create the test signal that includes a pseudorandom binary sequence (PRBS) test pattern; and
analyze a received PRBS test pattern in the test signal that is received by the second test device to determine the testing compliance of the at least one of the plurality of channels on the backplane.

6. The backplane testing system of claim 1, further comprising:
a testing system that is coupled to the second test device, wherein the testing system is configured to:
determine eye details of the test signal that is received by the second test device.

7. The backplane testing system of claim 1, wherein the testing compliance of the at least one of the plurality of channels on the backplane is a speed testing compliance.

8. A backplane testing system, comprising:
a first test device that is configured to engage a first connector system on a backplane and that includes a loop back circuit;
a second test device that is configured to engage a second connector system on the backplane, wherein the second test device is configured to:
send a test signal through the second connector system such that the test signal is provided through at least one channel on the backplane and through the first connector system to the loop back circuit on the first test device; and
receive the test signal back through second connector system in response to the loop back circuit routing the test signal through the first connector system such that the test signal is provided through at least one channel on the backplane and through the second connector system; and
at least one analyzer subsystem that is configured to:
analyze the test signal that is received by the second test device to determine a testing compliance of the backplane.

9. The backplane testing system of claim 8, wherein the backplane is a networking device backplane, the first connector system is a line module connector system, and the second connector system is a route processing module connector system.

10. The backplane testing system of claim 8, wherein the first test device engages the first connector system that is configured to connect a plurality of devices to the backplane.

11. The backplane testing system of claim 8, wherein the first test device engages a transmitter connection and a receiver connection on the first connector system to connect the transmitter connection and the receiver connection to the loop back circuit.

12. The backplane testing system of claim 8, further comprising:
an analyzer system that is coupled to the second test device and that is configured to:
create the test signal that includes a pseudorandom binary sequence (PRBS) test pattern; and
analyze a received PRBS test pattern in the test signal that is received by the second test device to determine the testing compliance of the backplane.

13. The backplane testing system of claim 8, wherein the testing compliance of the backplane is a speed testing compliance.

14. A method for testing a backplane, comprising:
sending, using a first test device, a test signal through a first connector system on a backplane such that the test signal is provided through at least one channel on the backplane;
receiving, using a second test device, the test signal through a second connector system on the backplane;
returning, using a loop back circuit in the second test device, the test signal through the second connector system and at least one channel on the backplane;
receiving, using the first test device, the test signal back through first connector system; and
analyzing, using at least one analyzer subsystem that is coupled to the first test device, the test signal that is received using the first test device to determine a testing compliance of the backplane.

15. The method of claim 14, wherein the backplane is a backplane, the first connector system is a route processing module connector system, and the second connector system is a line module connector system.

16. The method of claim 15, wherein the second test device engages the second connector system that is configured to connect a plurality of devices to the backplane.

17. The method of claim 14, wherein the second test device engages a transmitter connection and a receiver connection on the second connector system to connect the transmitter connection and the receiver connection to the loop back circuit.

18. The method of claim 14, further comprising:
creating, by an analyzer system that is coupled to the first test device, the test signal that includes a pseudorandom binary sequence (PRBS) test pattern; and
analyzing, by the analyzer system, a received PRBS test pattern in the test signal that is received using the first test device to determine the testing compliance of the backplane.

19. The method of claim 14, further comprising:
determining, by a testing system that is coupled to the first test device, eye details of the test signal that is received using the first test device.

20. The method of claim 14, wherein the testing compliance of the backplane is a speed testing compliance.

* * * * *